US005809095A

United States Patent [19]

Nakao

[11] Patent Number: 5,809,095

[45] Date of Patent: Sep. 15, 1998

[54] SYNCHRONOUS SIGNAL OUTPUT CIRCUIT

[75] Inventor: Takehiko Nakao, Yokohama, Japan

[73] Assignee: Kabushiki Kaisha Toshiba, Tokyo, Japan

[21] Appl. No.: 599,237

[22] Filed: Feb. 9, 1996

[30] Foreign Application Priority Data

Feb. 10, 1995 [JP] Japan .................................... 7-022959

[51] Int. Cl.[6] ...................................................... H04L 7/089

[52] U.S. Cl. ............................ 375/374; 375/376; 331/17; 327/157

[58] Field of Search .................................... 375/373–376; 327/5, 148, 157, 536, 537; 330/252, 253, 259, 261; 331/1 R, 17, 18, 25

[56] References Cited

U.S. PATENT DOCUMENTS 4,970,472 11/1990 Kennedy et al. ........................... 331/8
5,477,193 12/1995 Burchfield ................................ 331/18
5,576,647 11/1996 Sutardja et al. ........................ 327/108
5,576,657 11/1996 Frisch et al. ............................ 327/543
5,592,370 1/1997 Rogers ...................................... 363/60

*Primary Examiner*—Don N. Vo
*Assistant Examiner*—Amanda T. Le
*Attorney, Agent, or Firm*—Loeb & Loeb LLP

[57] ABSTRACT

The synchronous circuit adopts a differential signal propagation to reduce in-phase noise by restoring the charge loss caused by leak current. A synchronous circuit comprises: a comparing circuit (12) for comparing an input signal (IN) or a signal formed on the basis of the input signal with a feedback signal (OUT) or a signal formed on the basis of the feedback signal with respect to phase or frequency; a signal forming circuit (13) for forming a first and second output signals (13A and 13B) as a differential signal on the basis of the outputs (12A and 12B) of the comparing circuit; a filter circuit (14) for eliminating high frequency region noise of the first and second output signals (13A and 13B) outputted by the signal forming circuit; and an output circuit (15) for outputting the feedback signal (OUT) whose phase or frequency is adjusted according to a difference between the first and second output signals (14A and 14B) passed through the filter circuit. Here, the signal forming circuit (13) fixes any one of the first and second output signals (13A and 13B) to a predetermined direct current voltage.

12 Claims, 9 Drawing Sheets

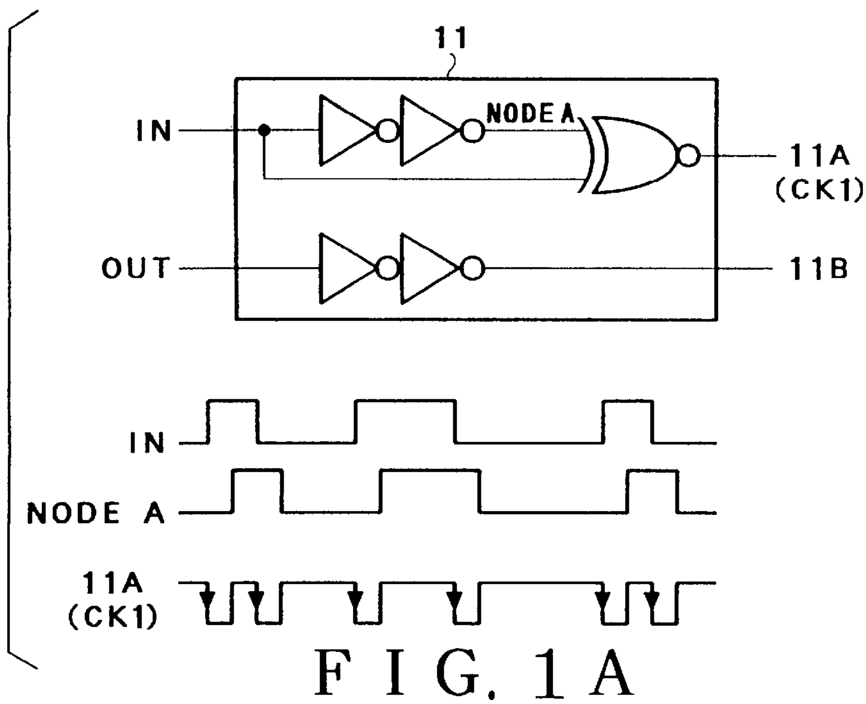
F I G. 1 A
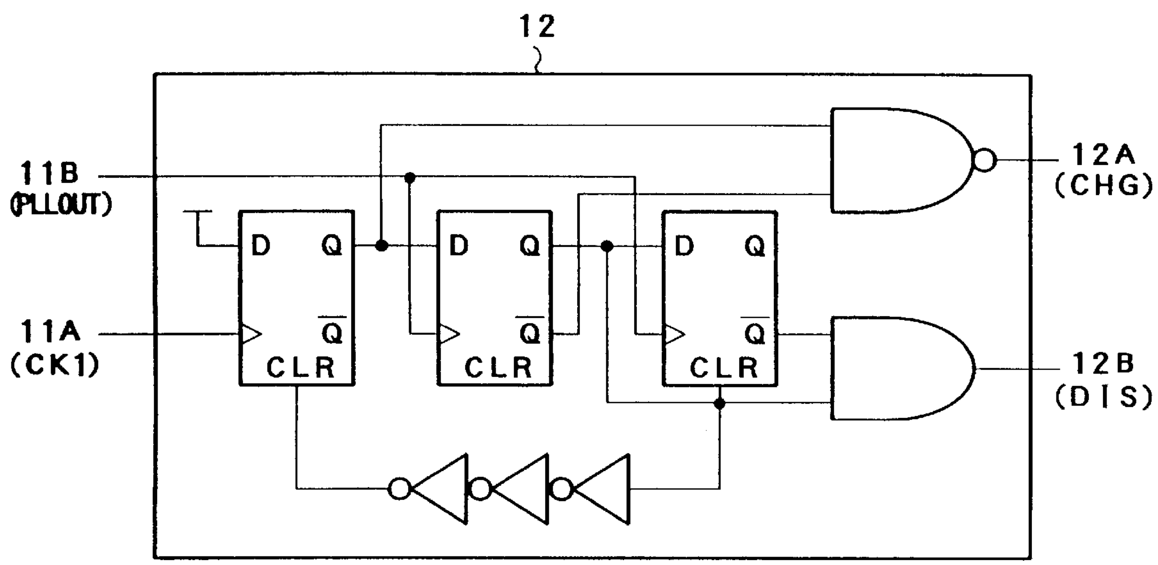
F I G. 1 B

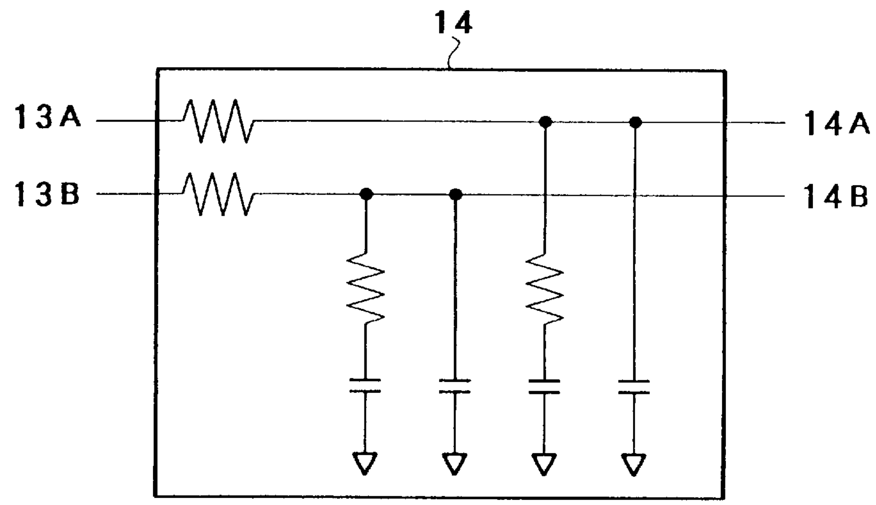
F I G. 1 C
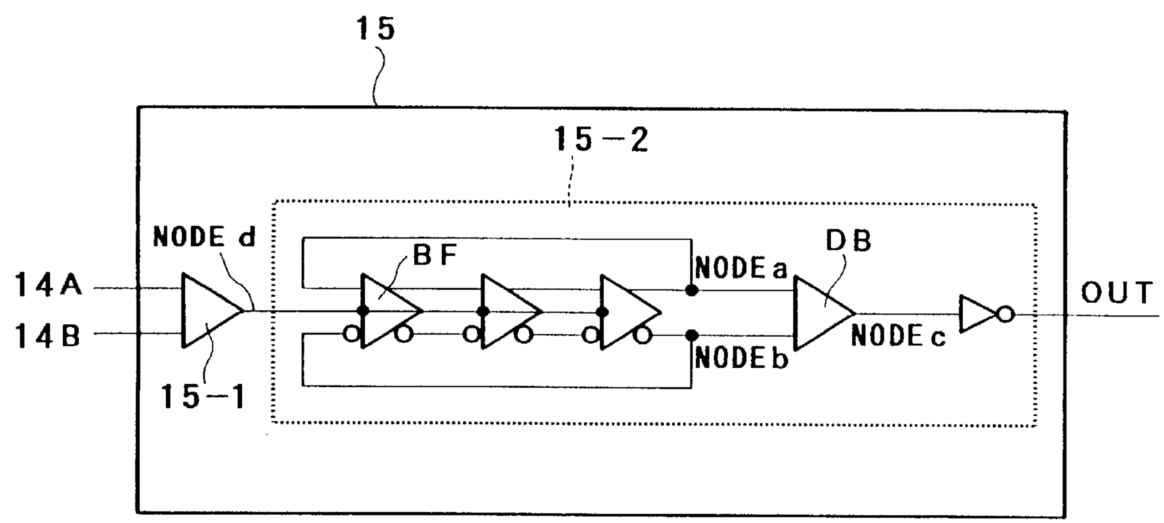
F I G. 1 D

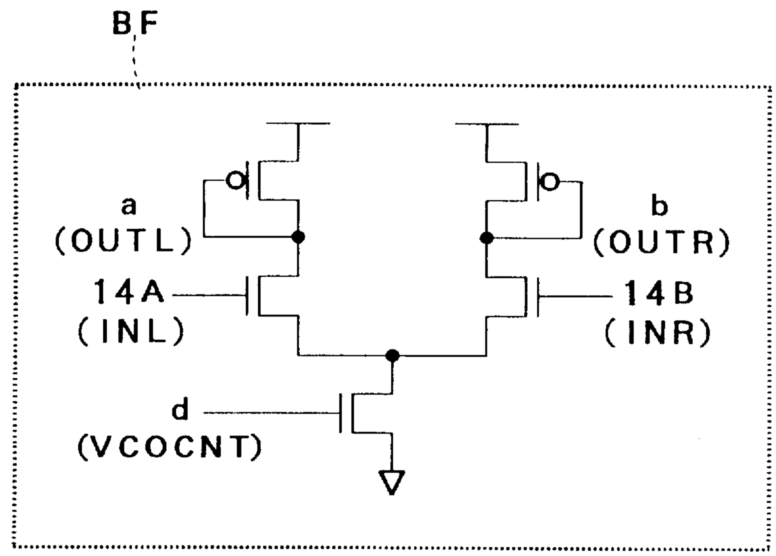
F I G. 1 E
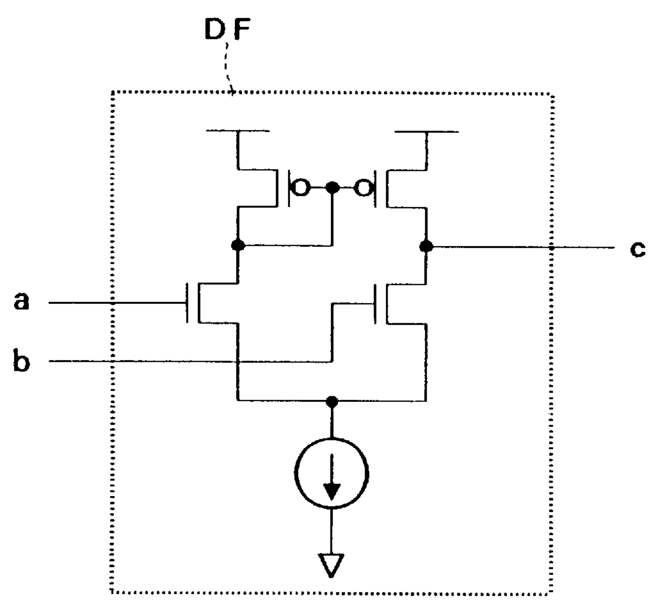
F I G. 1 F

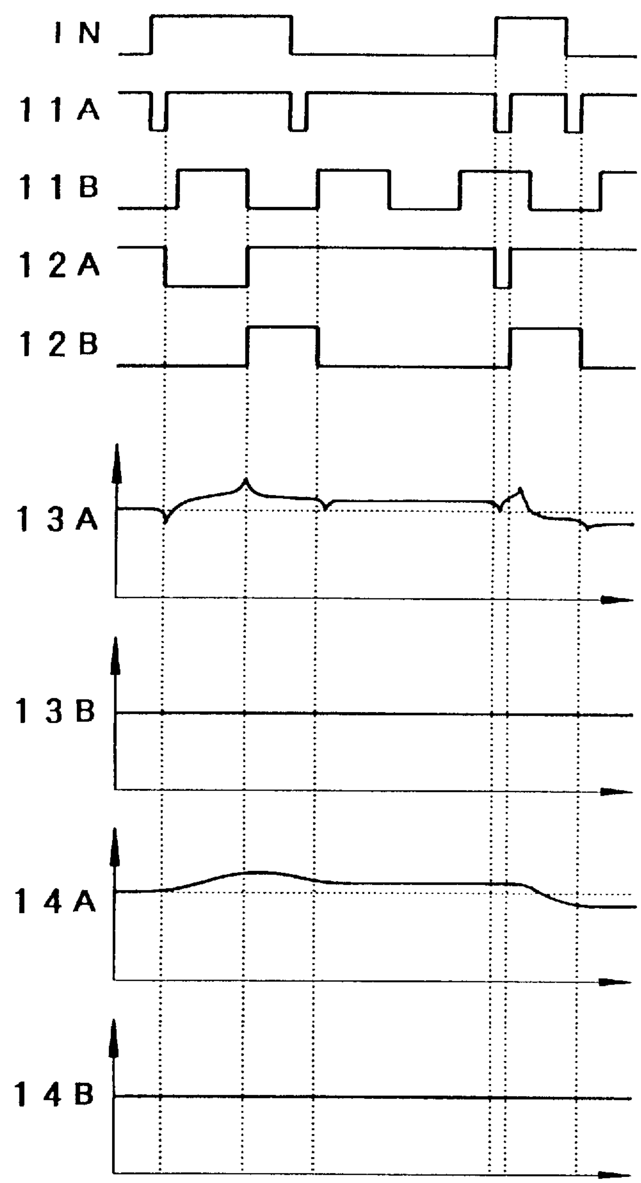
F I G. 2

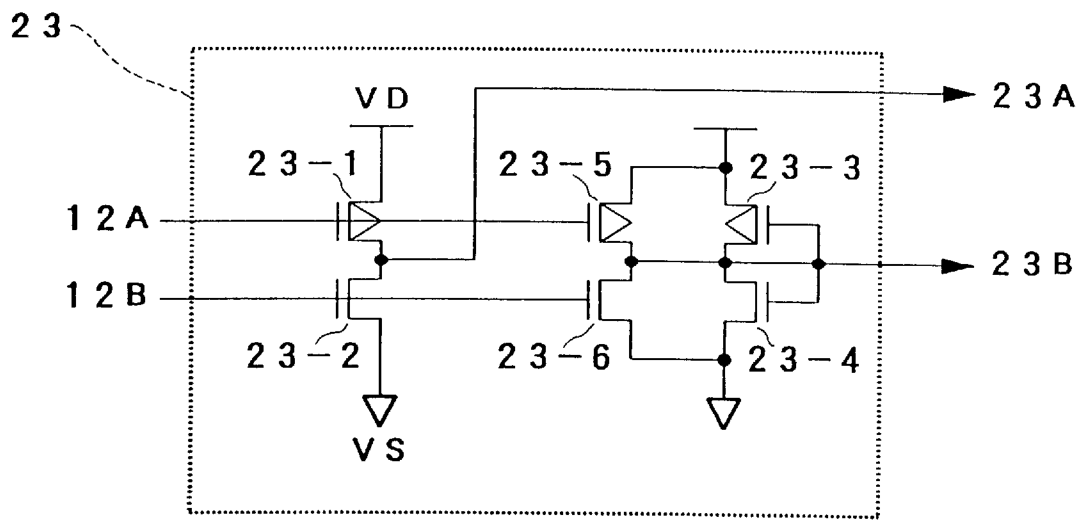
F I G. 3
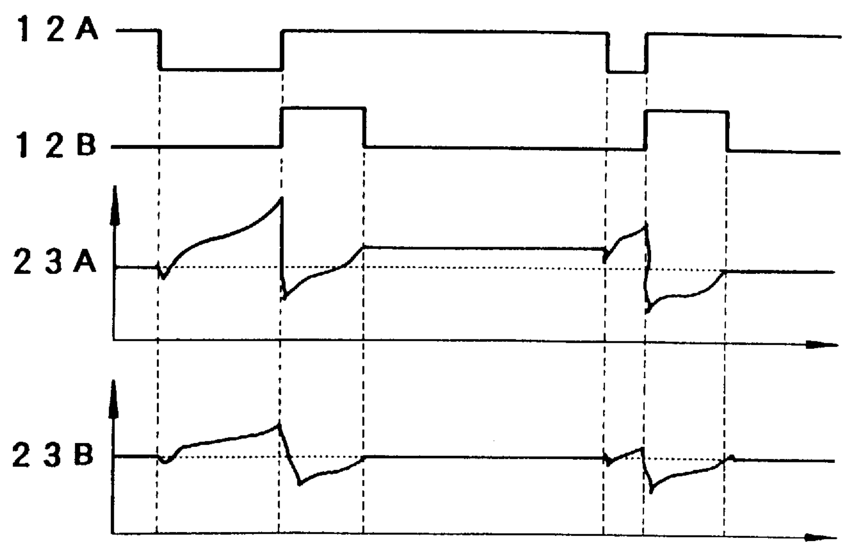
F I G. 4

SYNCHRONOUS SIGNAL OUTPUT CIRCUIT

FIELD OF THE INVENTION

The present invention relates to a synchronous circuit used for data communications, for instance.

BACKGROUND OF THE INVENTION

In the field of data communications, in general, a clock and data are transmitted through a single signal line, and both the clock and data are reproduced and separated on the reception side. In the case of the data transmission and reception, a so-called NRZ (non-return-to-zero) signal is used. In this NRZ signal, as shown in FIG. 5, a clock and data are transmitted and received simultaneously by holding the data value (e.g., "1") during one period of the clock.

Recently, with an increase of the importance of the NRZ coding for transmitting and receiving clock and data at the same time through a single signal line in the high speed data communications, a technique of extracting clock and further for reproducing data from the NRZ signal has become important more and more.

FIG. 6 shows an internal circuit construction of a conventional phase and frequency synchronous circuit indispensable for reproducing the clock.

The phase and frequency synchronous circuit shown in FIG. 6 is an example used for propagating a differential signal. In the drawing, an NRZ signal is inputted to the same circuit as an input signal IN. The synchronous circuit is composed of a data change point detector 111, a phase comparator 112, a charge pump 113, a low-pass filter 114, and a voltage controlled oscillator (referred to as VCO, hereinafter) 115.

The data change point detector 111 detects a point at which the input signal IN changes in voltage level, and delays a feedback signal applied by the VCO 115 by a time corresponding to the detected change point, in order to generate an output OUT synchronized in phase and frequency with the input signal IN. An output signal 111A relates to the input (NRZ) signal IN, and an output signal 111B relates to the output signal OUT of the VCO 115.

The phase comparator 112 compares the phases of both the output signals 111A and 111B of the data change point detector 111, activates an output signal 112A thereof and an output signal 112B thereof (opposite in level to the output signal 112A) only during a period corresponding to the phase difference between the two output signals 111A and 111B, and, immediately after this, activates a control signal 112C thereof and a control signal 112D thereof (opposite in level to the control signal 112C) only during a half period of the output signal of the VCO 115.

The charge pump 113 converts the control signals 112A, 112B, 112C and 112D applied by the phase comparator 112 into currents corresponding thereto. Here, the charge pump 113 operates in such a way that an output 113A is formed on the basis of the two control signals 112A and 112C, and an output 113B is formed on the basis of the two control signals 112B and 112D. Further, the charge pump 113 operates in such a way that current is charged to the succeeding stage circuit during the period where the two control signals 112A and 112D are being activated, but current is discharged from the succeeding stage circuit during the period where the two control signals 112B and 112C are being activated. In other words, the two output signals 113A and 113B of the charge pump 113 form a differential signal in such a way that when one signal increases, the other signal decreases or vice versa.

The low-pass filter is used to smoothen the two outputs 113A and 113B of the charge pump 113. In practice, however, the charge rate of capacitors within this low-pass filter decides an oscillation frequency of the VCO 115.

The VCO 115 has a differential amplifier 115*a* for obtaining a difference between two outputs 114A and 114B of the low-pass filter 114 and for eliminating in-phase noise therefrom to form a control signal. On the basis of this formed control signal, the oscillation frequency of the oscillator 115*b* is controlled.

As described above, in the conventional synchronous circuit, the jitter of the output OUT of the VCO 15 can be reduced, by eliminating the harmful influence of in-phase noise from the oscillation frequency control signal outputted by the differential amplifier 115*a* of the VCO 115 on the basis of the differential signal obtained by the two outputs 112A and 112B of the charge pump 113.

Further, FIG. 7 shows a timing chart of the circuit shown in FIG. 6, in which the waveforms of the above-mentioned major signals explained with reference to FIG. 6 are shown.

In the conventional synchronous circuit as shown in FIG. 6, however, in the case of the propagation of the ordinary differential signal, when the voltage of the output 114A of the low-pass filter 114 increases, since the inverted signal 114B thereof decreases, such a status that the voltages of the two signals increase at the same time will not occur, irrespective of the phase relationship between the input signal IN and the output OUT. However, since the charge accumulated in the capacitors within the low-pass filter 114 is discharged due to leak current, the voltages of both the outputs 114A and 114B decrease with the lapse of time, so that any one of them reaches the ground potential finally. In this status, since one of the two input signals applied to the differential amplifier 115*a* for eliminating in-phase noise cannot operate the transistor of the input stage of the differential amplifier 115*a*, the in-phase noise cannot be eliminated, thus disabling the operation of the differential signal propagation.

In addition, in the conventional synchronous circuit as shown in FIG. 6, since the outputs 114A and 114B of the low-pass filter 114 fluctuate in response to the control signals 112A, 112B, 112C and 112D of the phase comparator 112 as shown in FIG. 7, the difference between the two outputs 114A and 114B increases when the control signals 112A and 112B are both being activated, but decreases when the control signals 112C and 112D are both being activated. Here, since the four control signals 112A, 112B, 112C and 112D outputted by the phase comparator 112 are activated even in such a stable status that the output OUT of the synchronous circuit is synchronized with the input signal IN, the output OUT of the VCO 115 fluctuates even in the stable operation due to the reason other than the in-phase noise. As a result, the jitter of the output OUT appears, which cannot be so far solved in the ordinary differential signal propagation.

SUMMARY OF THE INVENTION

With these problems in mind, therefore, it is the object of the present invention to provide a synchronous circuit for adopting the differential signal propagation, which can restore a charge loss caused by leak current in order to reduce in-phase noise thereof.

Further, the other object of the present invention is to provide a synchronous circuit which can reduce jitter of the synchronous output signal caused by the operation of the phase comparator.

To achieve the above-mentioned object, the present invention provides a synchronous circuit, comprising: a phase comparing circuit for comparing phases of an input signal having a frequency to be set as data and a feedback signal outputted by the synchronous circuit to obtain a phase difference between the two, and for activating a first control signal as a first output for only a period corresponding to the detected phase difference and activating a second control signal as a second output for a half period of the feedback signal immediately after an end of the activation of the first control signal; a signal forming circuit having a first circuit and a second circuit both connected between a common high supply voltage and a common low voltage supply voltage, the first circuit responsive to the first and second control signals outputting a first output corresponding to the first and second control signals, the second circuit outputting an intermediate fixed potential between the high and low supply voltages as a second output; a filter circuit for eliminating noise in a high frequency region from the first and second outputs; and an output circuit for outputting a signal having a phase adjusted according to a difference between the first and second outputs outputted by said filter circuit, as an output signal of the synchronous circuit.

Further, the present invention provides a synchronous circuit, comprising: a phase comparing circuit for comparing phases of an input signal having a frequency to be set as data and a feedback signal outputted by the synchronous circuit to obtain a phase difference between the two, and for activating a first control signal as a first output for only a period corresponding to the detected phase difference and activating a second control signal as a second output for a half period of the feedback signal immediately after an end of the activation of the first control signal; a signal forming circuit having a first circuit and a second circuit both connected between a common high supply voltage and a common low voltage supply voltage, the first circuit responsive to the first and second control signals outputting a first output corresponding to the first and second control signals, the second circuit outputting an intermediate fixed potential between the high and low supply voltages as a second output changed in alternating current fashion on the basis of the first and second control signals; a filter circuit for eliminating noise of a high frequency region from the first and second outputs; and an output circuit for outputting a signal having a phase adjusted according to a difference between the first and second outputs outputted by said filter circuit, as an output signal of the synchronous circuit.

Further, the present invention provides a synchronous circuit, comprising: a comparing circuit for comparing an input signal or a signal formed on the basis of the input signal with a feedback signal or a signal formed on the basis of the feedback signal with respect to phase or frequency; a signal forming circuit for forming a first output signal and a second output signal fixed to a predetermined direct current voltage level as a differential signal on the basis of the outputs of said comparing circuit; and a filter circuit for eliminating high frequency region noise of the first and second output signals outputted by said signal forming circuit; and an output circuit for outputting the feedback signal whose phase or frequency is adjusted according to a difference between the first and second output signals passed through said filter circuit.

Further, the present invention provides a synchronous circuit, comprising: a comparing circuit for comparing an input signal or a signal formed on the basis of the input signal with a feedback signal or a signal formed on the basis of the feedback signal with respect to phase or frequency; a signal forming circuit for forming a first and second output signals as a differential signal on the basis of the outputs of said comparing circuit; a filter circuit for eliminating high frequency region noise of the first and second output signals outputted by said signal forming circuit; and an output circuit for outputting the feedback signal whose phase or frequency is adjusted according to a difference between the first and second output signals passed through said filter circuit, and wherein said signal forming circuit is composed of: a first signal forming section for forming the first output signal on the basis of the outputs of said comparing circuit; and a second signal forming section having: a first circuit for forming a signal fixed to a predetermined direct current potential; and a second circuit connected to said first circuit to form a signal corresponding to the outputs of said comparing circuit, for forming the second output signal fixed to a predetermined direct current potential and changing in alternating current fashion in phase with the first output signal.

In the synchronous circuit according to the present invention, since one of the first and second output signals of the signal forming circuit is fixed to a predetermined dc voltage value, it is possible to compensate for the charge loss caused by leak current, quickly.

Further, in the synchronous circuit according to the present invention, since the first output signal is formed on the basis of the first and second control signals of the comparator circuit and further since the signal fixed to a predetermined dc voltage value is used as the second output signal, the first signal can be used to decide the phase and the frequency of the feedback signal; on the other hand, the second output signal can be used to eliminate the in-phase noise. Accordingly, it is possible to compensate for the charge loss due to leak current of the second output signal immediately, so that the harmful influence of the charge loss of the first output signal can be eliminated within the operation of the synchronous loop. Further, since the comparator circuit is so constructed as described above, it is possible to cope with an irregular input signal (e.g., NRZ signal).

Further, in the synchronous circuit according to the present invention, since the signal forming circuit is so constructed as described above, it is possible to form the first and second output signals securely in spite of a simple construction.

Further, in the synchronous circuit according to the present invention, since the second output signal is so formed as to be fixed to a predetermined dc voltage and to fluctuate in phase with the first output signal as an ac voltage, it is possible to eliminate the fluctuation of difference between the first and second output signals.

Further, in the synchronous circuit according to the present invention, the synchronous circuit according to the present invention can cope with an irregular input signal (e.g., NRZ signal). In addition, since the signal forming circuit is so constructed as described above, it is possible to form the first and second output signals securely in spite of a simple circuit construction.

BRIEF DESCRIPTION OF THE DRAWINGS

FIG. 1A is a practical circuit diagram showing a data change point detector shown in FIG. 1;

FIG. 1B is a practical circuit diagram showing a phase comparator shown in FIG. 1;

FIG. 1C is a practical circuit diagram showing a low-pass filter shown in FIG. 1;

FIG. 1D is a practical circuit diagram showing a VCO (voltage controlled oscillator or output circuit) shown in FIG. 1;

FIG. 1E is a practical circuit diagram showing a buffer BF shown in FIG. 1D;

FIG. 1F is a practical circuit diagram showing a differential buffer DB shown in FIG. 1D;

FIG. 2 is a timing chart showing the major signals of the synchronous circuit shown in FIG. 1;

FIG. 3 is a circuit diagram showing the construction of the charge pump of the second embodiment of the synchronous circuit according to the present invention;

FIG. 4 is a timing chart showing the outputs 23A and 23B of the charge pump 23 of the synchronous circuit shown in FIG. 3;

DETAILED DESCRIPTION OF THE EMBODIMENTS

Figure 1:
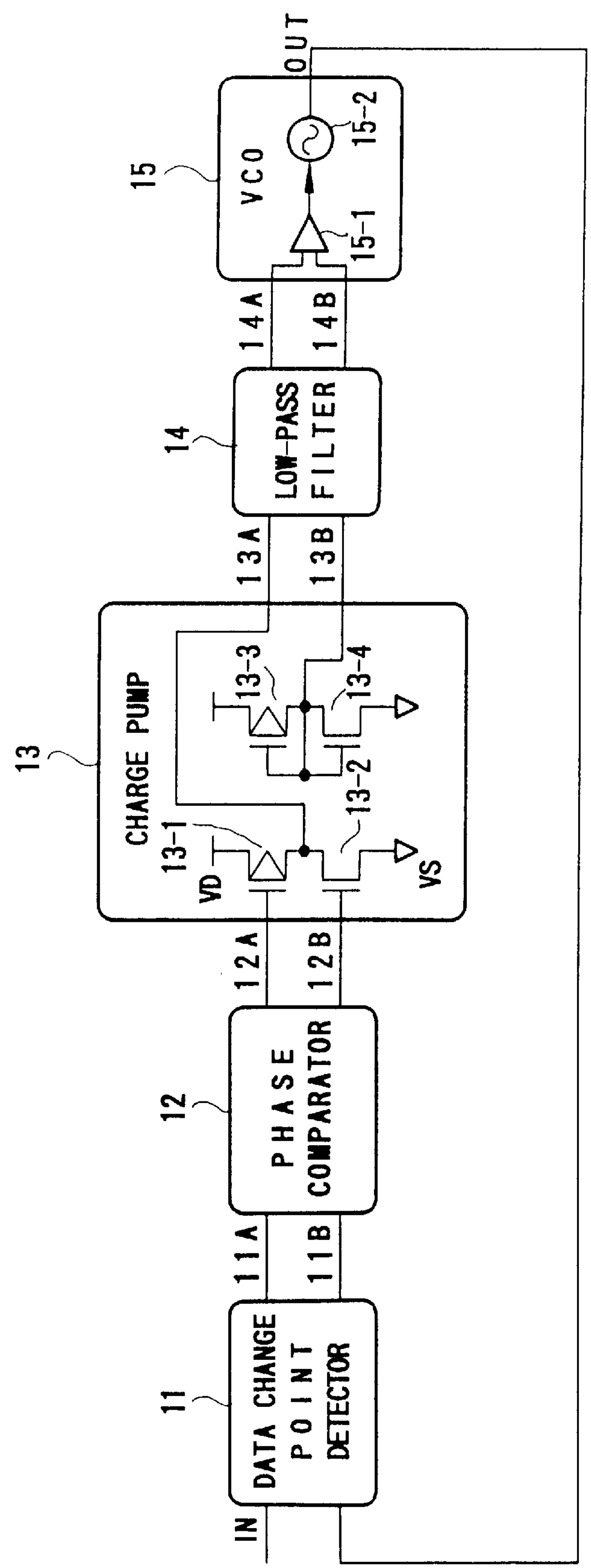
FIG. 1 is a block diagram showing the construction of a first embodiment of the synchronous circuit according to the present invention.

Some embodiments of the present invention will be described hereinbelow with reference to the attached drawings. FIG. 1 is a block diagram showing a first embodiment of the synchronous circuit according to the present invention; and FIG. 2 is a timing chart showing the major signals of the synchronous circuit shown in FIG. 1.

Figure 5:
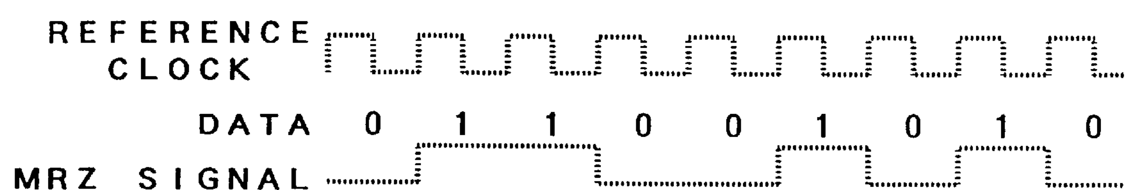
FIG. 5 is a waveform diagram showing the method of forming the NRZ signal.

The synchronous circuit is provided with such a function as to input an NRZ signal IN (See FIG. 5) and output an output signal OUT synchronized in phase and frequency with the NRZ signal IN. The synchronous circuit is composed of a data change point detector 11, a phase comparator (comparing circuit) 12, a charge pump (signal forming circuit) 13, a low-pass filter (filter circuit) 14, and a voltage controlled oscillator VCO (output circuit) 115.

Figure 6:
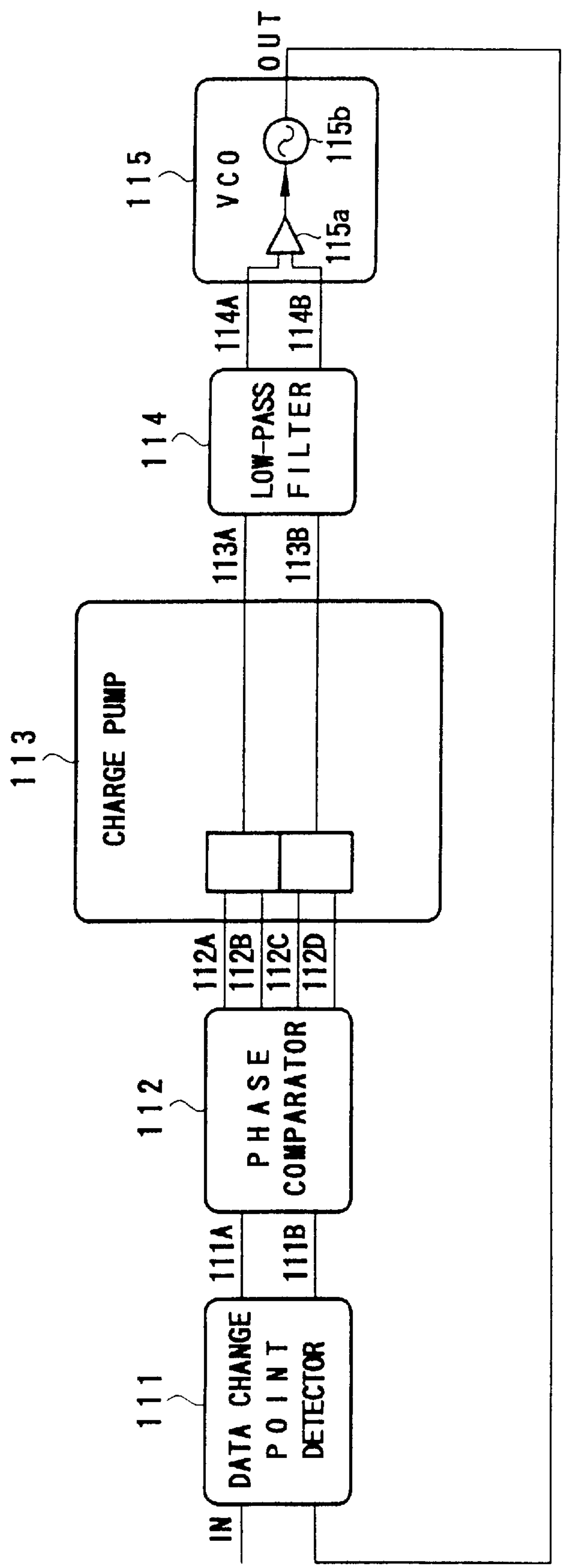
FIG. 6 is a block diagram showing an internal construction of the conventional phase and frequency synchronous circuit.
Figure 7:
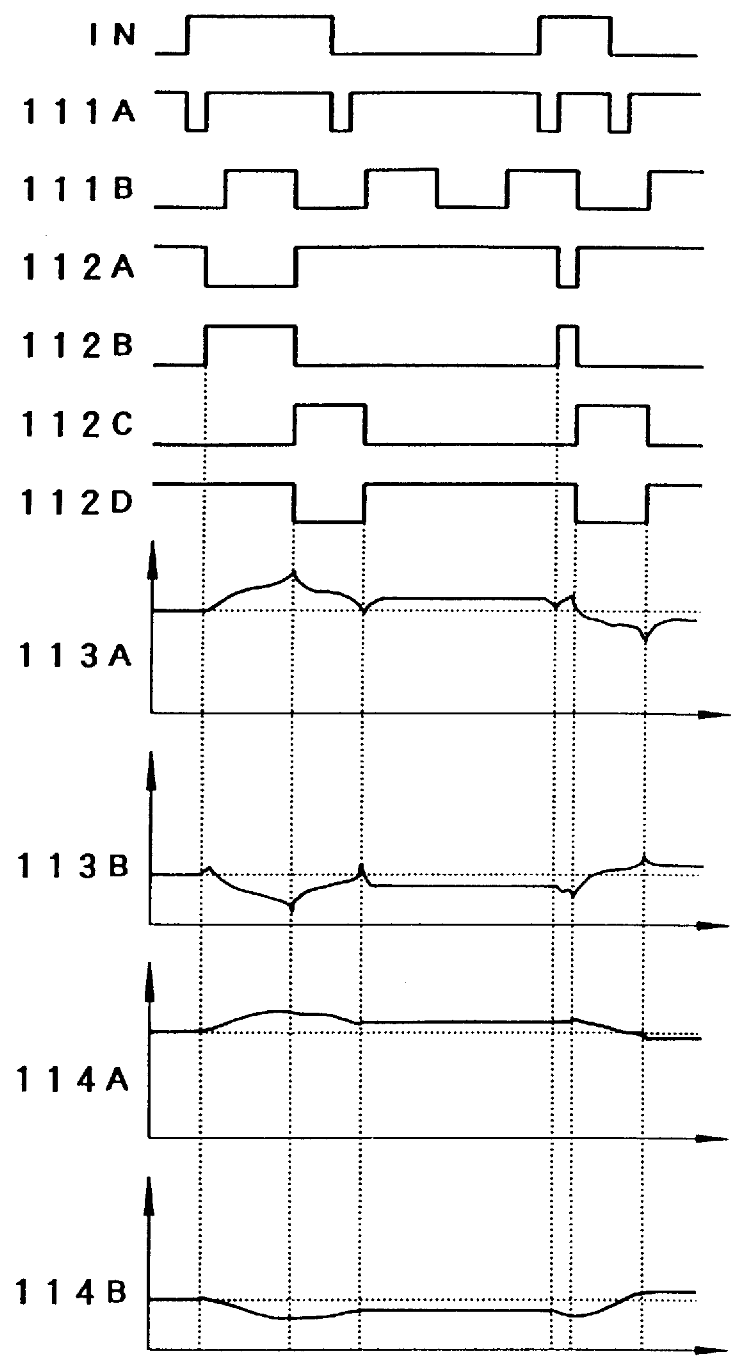
FIG. 7 is a timing chart showing the major signals of the conventional synchronous circuit shown in FIG. 6.

The data change point detector 11 detects a point at which the input signal IN changes in voltage level in the same way as with the case of the conventional circuit shown in FIG. 6, and delays a feedback signal applied by the VCO 115 by a time corresponding to the detected change point. An output signal 11A relates to the input (NRZ) signal IN, and an output signal 11B relates to the output signal OUT of the VCO 115. This data change point detector 11 is a well-known circuit in the art, and therefore only a practical circuit example thereof is shown in FIG. 1A, in which the signal waveforms at the major nodes are also shown to facilitate understanding of the operation thereof, without any the detailed description thereof.

The phase comparator 12 compares both the phases (or frequencies) of the output signals 11A and 11B of the data change point detector 11, activates a first control signal 12A (i.e., a first output signal thereof) to an "L" level as shown by (a) in FIG. 2 only during a period corresponding to the phase difference (or frequency difference) between the two output signals 11A and 11B, and, immediately after this, activates a second control signal 12B (i.e., a second output signal thereof) to an "H" level as shown by (b) in FIG. 2 only during a half period of the output signal OUT of the VCO 15. The phase comparator 12 is also a well-known circuit in the art, and therefore only a practical circuit example thereof is shown in FIG. 1B, without any detailed description thereof.

The charge pump 13 is composed of a first P-channel MOS FET 13-1, a first N-channel MOS FET 13-2, a second P-channel MOS FET 13-3, and a second N-channel MOS FET 13-4. The control signal 12A is applied to a gate of the first P-channel MOS FET 13-1 having a source connected to a high supply voltage VD; the control signal 12B is applied to a gate of the first N-channel MOS FET 13-2 having a source connected to a low supply voltage VS; and a first output signal 13A is outputted from a junction point (a first node) between two drains of the two MOS FETs 13-1 and 13-2. On the other hand, a gate of the second P-channel MOS FET 13-3 having a source connected to the supply voltage VD is connected in common to a drain of the same FET 13-3; a gate of the second N-channel MOS FET 13-4 having a source connected to the supply voltage VS is connected in common to a drain of the same FET 13-4; and a second output signal 13B is outputted from a junction point (a second node) between two drains of the two MOS FETs 13-3 and 13-4. Here, the driving capability of the two MOS FETs 13-3 and 13-4 are determined equal to each other, and the second output signal 13B is fixed to a dc voltage value about half of the supply voltage (at a dc level as shown in FIG. 2). In this case, however, it is also possible to set the output 13B to a voltage level shifted upward or downward from the half of the supply voltage.

The low-pass filter 14 is composed of two capacitors provided for two inputs, respectively, in the same way as with the case of the conventional circuit shown in FIG. 6. The low-pass filter 14 eliminates high-frequency noise of the first and second output signals 13A and 13B of the charge pump 13, and outputs the two smoothened outputs 14A and 14B (as shown by in FIG. 2). Here, since the second output signal 13B of the charge pump 13 is fixed to a dc voltage value about half of the supply voltage, the output 14B is also fixed to the same voltage value. The low-pass filter 14 is also a well-known circuit in the art, and therefore only a practical circuit example thereof is shown in FIG. 1C, without any detailed description thereof.

The VCO 115 is composed of a differential amplifier 15-1 and an oscillator 15-2. The two outputs 14A and 14B of the low-pass filter 14 are inputted to the differential amplifier 15-1 to form a control voltage for controlling the oscillation frequency of the oscillator 15-2 which transmits the output signal OUT (also used as a feedback signal). Here, it should be noted that the differential amplifier 15-1 of the VCO 15 forms the control voltage by obtaining a difference between the two outputs 14A and 14B applied by the low-pass filter 14, so that it is possible to eliminate in-phase noise inputted to the low-pass filter 14. The VCO 15 is also a well-known circuit in the art, and therefore only a practical circuit example thereof is shown in FIG. 1D, without any detailed description thereof. Further, the buffer BF shown in FIG. 1D is also a well-known circuit in the art, and therefore only a practical circuit example thereof is shown in FIG. 1E, without any description thereof. In the same way, the differential buffer DB shown in FIG. 1D is also a well-known circuit in the art, and therefore only a practical circuit example thereof is shown in FIG. 1F, without any detailed description thereof.

With respect to the VCO 15, in the two outputs 14A and 14B of the low-pass filter 14, since the output 14B is fixed to a voltage value about half of the supply voltage, there exists no possibility that a harmful influence of the charge loss caused by leak current occurs on the side of the output

14B. Therefore, the harmful influence is produced only on the side of the output 14A. Here, when the capacitor on the side of the output 14A is discharged by a leak current and thereby the voltage of the output 14A decreases, since a voltage difference between the two outputs 14A and 14B of the low-pass filter 14 changes, the oscillation frequency of the VCO 15 also changes. As a result, the phase difference between the NRZ signal IN and the output OUT of the VCO 15 changes, so that the synchronous circuit operates in such a way as to reduce the phase difference between the two down to zero.

As described above, in this first embodiment, the output 14B of the low-pass filter 14 is used to eliminate the in-phase noise, and the voltage of the output 14A of the low-pass filter 14 is used to decide the oscillation frequency of the VCO 15. Accordingly, there exists no problem even if a charge loss occurs on the side of the output 14A, and further the charge loss on the side of the output 14B can be restored immediately; as a result, it is possible to reduce the in-phase noise inputted to the low-pass filter 14 securely by the VCO 15.

A second embodiment of the synchronous circuit according to the present invention will be described hereinbelow with reference to FIGS. 3 and 4.

This second embodiment is different from the first embodiment in the construction of only the charge pump, without changing the other composing elements of the first embodiment.

FIG. 3 shows the construction of the charge pump 23. This charge pump 23 can be replaced with the charge pump 13 shown in FIG. 1. In more detail, the two outputs 23A and 23B of this charge pump 23 can be used instead of the outputs 13A and 13B of the charge pump 13 shown in FIG. 1, and applied to the succeeding stage low-pass filter 14.

As shown, the charge pump 23 is composed of a first signal forming section and a second signal forming section. The first signal forming section is made up of a first P-channel MOS FET 23-1 and a first N-channel MOS FET 23-2. Further, the second signal forming section is made up of a first circuit having a second P-channel MOS FET 23-3 and a second N-channel MOS FET 23-4, and a second circuit having a third P-channel MOS FET 23-5 and a third N-channel MOS FET 23-6.

In more detail, the control signal 12A of the phase comparator 12 shown in FIG. 1 is applied to a gate of the first P-channel MOS FET 23-1 having a source connected to a first supply voltage VD; the control signal 12B of the phase comparator 12 shown in FIG. 1 is applied to a gate of the first N-channel MOS FET 23-2 having a source connected to a second supply voltage VS; and a first output signal 23A is outputted from a junction point (a first node) between the two drains of the two MOS FETs 23-1 and 23-2. On the other hand, a gate of the second P-channel MOS FET 23-3 having a source connected to the supply voltage VD is connected in common to a drain of the same FET 23-3; and a gate of the second N-channel MOS FET 23-4 having a source connected to the supply voltage VS is connected in common to a drain of the same FET 23-4. Further, the control signal 12A is applied to a gate of the third P-channel MOS FET 23-5 having a source and a drain connected in common to a source and a drain of the MOS FET 23-3, respectively; and the control signal 12B is applied to a gate of the third N-channel MOS FET 23-6 having a source and a drain connected in common to a source and a drain of the MOS FET 23-4, respectively.

FIG. 4 shows a timing chart, in which the waveforms of the two output signals 23A and 23B of the charge pump 23 shown in FIG. 3 and the two control signals 12A and 12B of the phase comparator 12 are shown together.

Here, although the output signal 23B of the charge pump 23 is fixed to a dc voltage value about half of the supply voltage, the output signal 23B fluctuates as an ac voltage in phase with the output signal 23A in response to the two control signals 12A and 12B. When the synchronous circuit enters a synchronous status in which the NRZ signal IN is synchronized in phase and frequency with the output OUT, the phase comparator 12 outputs the two control signals 12A and 12B of an equal pulse width. In other words, even in the synchronous state, the two output signals 23A and 23B of the charge pump 23 changes periodically. In this case, however, since the pulse width of the two control signals 12A and 12B are equal to each other, the current charge rate is equal to the current discharge rate, so that the voltage levels of the two output signals 23A and 23B of the charge pump 23 will not change before and after the periodic change thereof, respectively.

Here, the change of the outputs of the charge pump in the synchronous status causes the change of the oscillation frequency of the VCO. In this embodiment, however, the output 23B of the charge pump 23 changes in phase with the output 23A; the two output signals 23A and 23B of the charge pump 23 are outputted through the low-pass filter 14 of the succeeding stage; and a difference between the two outputs 23A and 23B is obtained by the VCO 15. Accordingly, the difference between the two outputs 14A and 14B of the low-pass filter 14 hardly fluctuates, so that it is possible to eliminate the fluctuations of the output OUT caused during the operation of the phase comparator 12 in the synchronous status.

As described above, in the synchronous circuit according to the present invention, since the signal forming circuit is so constructed that one of the first and second output signals is fixed to a predetermined dc voltage value, it is possible to immediately compensate for the charge loss caused by a leak current, with the result that the in-phase noise can be reduced securely.

Further, according to the present invention, the synchronous circuit can cope with an irregular input signal. For instance, when a regular clock signal is extracted from an irregular NRZ signal, it is possible to reduce the in-phase noise securely.

Further, according to the present invention, in the synchronous circuit, the signal forming circuit can form the first and second signals securely in spite of a simple circuit construction.

Further, according to the present invention, since the second output signal is formed in such a way as to be fixed to a predetermined dc potential and further as to fluctuate in phase with the first output as an ac voltage, the difference between the first and second output signals hardly fluctuates, so that it is possible to reduce the jitter of the synchronized output signal (which is caused by the operation of the comparator circuit).

Further, according to the present invention, the synchronous circuit can cope with an irregular input signal, and further it is possible to securely form the first and second output signals of the signal forming circuit, in spite of a simple circuit construction.

What is claimed is:

1. A synchronous circuit, comprising:

a phase comparing circuit for comparing phases of an input signal having a frequency to be set as data and a feedback signal outputted by the synchronous circuit to obtain a phase difference between the two, and for activating a first control signal as a first output for only a period corresponding to the detected phase difference and activating a second control signal as a second output for a half period of the feedback signal immediately after an end of the activation of the first control signal;

a signal forming circuit having a first circuit and a second circuit both connected between a common high supply voltage and a common low voltage supply voltage, the first circuit responsive to the first and second control signals outputting a first output corresponding to the first and second control signals, the second circuit outputting an intermediate fixed potential between the high and low supply voltages as a second output;

a passive type filter circuit having two passive filter circuits, noise in a high frequency region being removed from the first and second outputs when the first and second outputs pass through the two passive filter circuits, respectively; and an output circuit having third and fourth circuits, said third circuit removing in-phase noise on the basis of the first and second outputs, and the fourth circuit outputting a signal having a phase adjusted according to a difference between the first and second outputs outputted by said filter circuit, as the feedback signal of the synchronous circuit.

2. The synchronous circuit of claim 1, wherein:

the first circuit of said signal forming circuit includes first and second switching elements connected in series between the high and low supply voltages, the first and second control signals being inputted to control terminals of the first and second switching elements respectively, and the first output being outputted from a first junction point between the first and second switching elements, and the second circuit of said signal forming circuit includes third and fourth switching elements also connected in series between the high and low supply voltages, the second output being outputted from a second junction point between the third and fourth switching elements.

3. The synchronous circuit of claim 2, wherein control terminals of the third and fourth switching elements are connected to each other and further connected to the second junction point.

4. The synchronous circuit of claim 3, wherein the first and third switching elements are of p-channel MOS FET, and the second and fourth switching elements are of n-channel MOS FET.

5. A synchronous circuit, comprising:

a phase comparing circuit for comparing phases of an input signal having a frequency to be set as data and a feedback signal outputted by the synchronous circuit to obtain a phase difference between the two, and for activating a first control signal as a first output for only a period corresponding to the detected phase difference and activating a second control signal as a second output for a half period of the feedback signal immediately after an end of the activation of the first control signal;

a signal forming circuit having a first circuit and a second circuit both connected between a common high supply voltage and a common low voltage supply voltage, the first circuit responsive to the first and second control signals outputting a first output corresponding to the first and second control signals, the second circuit outputting an intermediate fixed potential between the high and low supply voltages as a second output changed in alternating current fashion on the basis of the first and second control signals;

a filter circuit for eliminating noise of a high frequency region from the first and second outputs; and an output circuit for outputting a signal having a phase adjusted according to a difference between the first and second outputs outputted by said filter circuit, as the feedback signal of the synchronous circuit.

6. The synchronous circuit of claim 5, wherein:

the first circuit of said signal forming circuit includes a first and second switching elements connected in series between the high and low supply voltages, the first and second control signals being inputted to control terminals of the first and second switching elements respectively, and the first output being outputted from a first junction point between the first and second switching elements; and the second circuit of said signal forming circuit includes a first parallel circuit and a second parallel circuit connected in parallel to each other between the high and low supply voltages respectively, the first parallel circuit being composed of third and fourth switching elements also connected in series between the high and low supply voltages, the first and second control signals being applied to control terminals of the third and fourth switching elements respectively, the second parallel circuit being composed of fifth and sixth switching elements also connected in series between the high and low supply voltages, control terminals of the fifth and sixth switching elements being connected to each other and further connected to a junction point between the fifth and sixth switching elements, an intermediate point between the third and fourth switching elements being connected to an intermediate point between the fifth and sixth switching elements, and the output of the synchronous circuit being outputted from these intermediate points.

7. The synchronous circuit of claim 6, wherein the first, third and fifth switching elements are of p-channel MOS FET, and the second, fourth and sixth switching elements are of n-channel MOS FET.

8. A synchronous circuit, comprising:

a comparing circuit for comparing an input signal or a signal formed on the basis of the input signal with a feedback signal or a signal formed on the basis of the feedback signal with respect to phase or frequency;

a signal forming circuit for forming a first output signal and a second output signal fixed to a predetermined direct current voltage level as a differential signal on the basis of outputs from said comparing circuit; and a passive type filter circuit having two passive filter circuits, high frequency noise being removed from the first and second output signals outputted by said signal forming circuit when the first and second output signals pass through the two passive filter circuits, respectively; and an output circuit having third and fourth circuits, said third circuit removing in-phase noise on the basis of the first and second output signals, and the fourth circuit outputting the feedback signal whose phase or frequency is adjusted according to a difference between the first and second output signals passed through said filter circuit.

9. The synchronous circuit of claim 8, wherein:

said comparing circuit outputs a first control signal having a pulse width determined according to a phase difference between the input signal or the signal formed on the basis of the input signal and the feedback signal or the signal formed on the basis of the feedback signal, and a second control signal activated for a half period of the feedback signal or the signal formed on the basis of the feedback signal; and said signal forming circuit forms the first output signal on the basis of the first and second control signals, and the second output signal as a signal fixed to a predetermined direct current voltage value.

10. The synchronous circuit of claim 9, wherein said signal forming circuit comprises:

a first P-channel MOS FET having a source connected to a first high supply voltage and a drain connected to a first node;

a first N-channel MOS FET having a drain connected to the first node and a source connected to a second low supply voltage;

a second P-channel MOS FET having a source connected to the first high supply voltage and a drain connected to a second node;

a second N-channel MOS FET having a drain connected to the second node and a source connected to the second low supply voltage, and wherein the first control signal is supplied to a gate of said first P-channel MOS FET and the second control signal is supplied to a gate of said first N-channel MOS FET, gates of said second P-channel MOS FET and said second N-channel MOS FET are connected in common to the second node, the first output signal being outputted from the first node and the second output signal being outputted from the second node, respectively.

11. A synchronous circuit, comprising:

a comparing circuit for comparing an input signal or a signal formed on the basis of the input signal with a feedback signal or a signal formed on the basis of the feedback signal with respect to phase or frequency;

a signal forming circuit for forming a first and second output signals as a differential signal on the basis of outputs from said comparing circuit;

a filter circuit for eliminating high frequency region noise of the first and second output signals outputted by said signal forming circuit; and an output circuit for outputting the feedback signal whose phase or frequency is adjusted according to a difference between the first and second output signals passed through said filter circuit, and wherein said signal forming circuit is composed of:

a first signal forming section for forming the first output signal on the basis of the outputs of said comparing circuit; and a second signal forming section having:

a first circuit for forming a signal fixed to a predetermined direct current potential; and a second circuit connected to said first circuit to form a signal corresponding to the outputs of said comparing circuit, for forming the second output signal fixed to a predetermined direct current potential and changing in alternating current fashion in phase with the first output signal.

12. The synchronous circuit of claim 11, wherein:

said comparing circuit outputs a first control signal having a pulse width determined according to a phase difference between the input signal or the signal formed on the basis of the input signal and the feedback signal or the signal formed on the basis of the feedback signal, and a second control signal activated for a half period of the feedback signal or the signal formed on the basis of the feedback signal; and said first signal forming section having:

a first P-channel MOS FET having a source connected to a first high supply voltage and a drain connected to a first node;

a first N-channel MOS FET having a drain connected to the first node and a source connected to a second low supply voltage; and the first control signal being supplied to a gate of said first P-channel MOS FET and the second control signal being supplied to a gate of said first N-channel MOS FET, respectively; and said second signal forming section having:

a second P-channel MOS FET having a source connected to the first high supply voltage and a drain connected to a second node, a second N-channel MOS FET having a drain connected to the second node and a source connected to the second low supply voltage;

gates of said second P-channel MOS FET and said second N-channel MOS FET being connected in common to the second node, to form said first circuit, a third P-channel MOS FET having a source and a drain in common with those of said second P-channel MOS FET;

a third N-channel MOS FET having a source and a drain in common with those of said second N-channel MOS FET; and the first control signal being supplied to a gate of said third P-channel MOS FET and the second control signal being supplied to a gate of said third N-channel MOS FET, respectively to construct said second circuit; and said signal forming circuit composed of said first and second signal forming sections outputting the first output signal from the first node and the second output signal from the second node.

* * * * *